United States Patent [19]

Karaila et al.

[11] 4,337,464

[45] Jun. 29, 1982

[54] METHOD AND CIRCUIT FOR CONTROLLING A BAND DISPLAY OF A PLURALITY OF ANALOG SIGNALS USING A SINGLE ANODE TYPE BAR GRAPH DEVICE

[75] Inventors: Ilkka Karaila, Pirkkala; Antero Hälikkä, Tampere, both of Finland

[73] Assignee: Valmet Oy, Finland

[21] Appl. No.: 107,389

[22] Filed: Dec. 26, 1979

[30] Foreign Application Priority Data

Dec. 29, 1978 [FI] Finland ................................ 784059

[51] Int. Cl.³ ............................................. G09G 3/00
[52] U.S. Cl. .................................. 340/753; 340/793; 340/771
[58] Field of Search ............... 340/753, 754, 767, 771, 340/772, 793, 722, 715

[56] References Cited

U.S. PATENT DOCUMENTS

| | | | |
|---|---|---|---|
| 3,922,666 | 11/1975 | Inami et al. | 340/753 |
| 4,009,414 | 2/1977 | Bockett-Pugh | 340/753 |
| 4,127,794 | 11/1978 | Frankland | 340/753 |
| 4,163,971 | 8/1979 | Morin et al. | 340/754 |
| 4,183,025 | 1/1980 | Kutaragi et al. | 340/722 |
| 4,224,616 | 9/1980 | Kamagata et al. | 340/753 |

FOREIGN PATENT DOCUMENTS 2744949 4/1979 Fed. Rep. of Germany ...... 340/753

*Primary Examiner*—Marshall M. Curtis
*Attorney, Agent, or Firm*—Steinberg & Raskin

[57] ABSTRACT

A method for a band display of at least two analog signals in a display device having a display scale with a plurality of successive display elements of which a part defined by an analog signal in each scanning cycle is made luminous by a specified scanning frequency to produce an analog display, comprises changing the current supply to the display elements and changing the scanning speed of the display elements to produce a three level variation of light intensity on the same display scale. A light spot of a specified length displaying the value of a first analog signal is provided on the display scale by a first level of light intensity. A uniform light column displaying the value of a second analog signal is provided on the display scale by a second, middle, level of light intensity. A separation is provided on the display scale between the first analog signal display and the second analog signal display by a third level of light intensity.

11 Claims, 3 Drawing Figures

METHOD AND CIRCUIT FOR CONTROLLING A BAND DISPLAY OF A PLURALITY OF ANALOG SIGNALS USING A SINGLE ANODE TYPE BAR GRAPH DEVICE

BACKGROUND OF THE INVENTION

The invention relates to a method and circuit for displaying at least two analog signals via a band display. The display scale consists of several successive display elements, of which the component defined by an analog signal in each scanning cycle is made luminous by a specific scanning frequency to produce an analog display.

The method and circuit of the invention are especially applicable to a visual display of two uninterrelated analog signals on one display scale of a gas discharge tube of the Burroughs SELF-SCAN type. A gas discharge tube of this type includes, for example, a neon-filled, two-branched flat, long glass envelope having opposite walls equipped with electrodes. The cathodes of the tube are divided into several components according to the various functions. The components include a reset cathode and three or five comb-like phase cathodes, the branches of which are sequentially interleaving. Each scale has its own anodes.

The anodes opposite the phase cathodes are transparent so that when a sufficient voltage is applied between an anode and a cathode, a gas discharge can be seen through the front glass of the scale as a light phenomenon. A discharge of this type may be started at the lower edge of the discharge tube scale. An anode and the first branch of the first phase cathode then locate the light phenomenon. The first branch of the second phase cathode is the next in sequence. When the control current is switched to the second phase cathode and the first phase cathode is disconnected, the discharge moves one step forward. One scale usually contains 201 step elements.

Known control circuits may produce on each scale of the gas discharge display tube a display of one analog signal for usually two-scaled display tubes. The function of the control circuit is to connect anode/cathode pairs in succession so that the discharge covers the whole scale within one operating cycle, if necessary. The propagation of the discharge can be stopped, if necessary, by disconnecting the anode current, for example. Scans of a sufficiently high frequency may be repeated past a selected number of sub-divisions to produce an analog display so that the eye sees the scan as a continuous display. The number of sub-divisions may be made comparable to the signal to be displayed as follows.

From a specific instant in time, the voltage of a linear ramp generator is permitted to increase and a phase generator controlling the cathodes of the discharge tube is simultaneously permitted to connect phase cathodes in succession to propagate the gas discharge on the scale. The ramp voltage is compared with the analog signal voltage in a comparator circuit. As soon as the ramp voltage reaches the analog signal voltage, the display of the discharge tube is switched off. A visual display of the analog signal is obtained by repeating the process.

The aforedescribed known method permits the display of the discharge tube to be made simultaneously at the two display branches, or in turn, by using separate anodes and controlling them.

If a gas discharge tube is used as a signal display unit of an analog process regulator, the problem of displaying three signals to the operator has to be solved. The known solutions are usually based on the display of two signals, a measurement point and a set point, on two scales of the discharge tube, as well as on the display of the starting signal in a separate indicator or display device. In the use of the regulator, the comparison of the measurement point and the set point is relevant. If the displays of these two values are on separate scales, a rapid comparison is difficult. If it is preferred to display two values on the same scale of the gas discharge tube, a solution must be found for obtaining a sufficient difference to identify the displays, so that such displays will not mix with each other during observation.

SUMMARY OF THE INVENTION

The principal object of the invention is to provide a method and circuit for controlling a band display, which provide clearly identifiable, separate displays of two analog signals on one scale of a display unit, as well as a second display of a third analog signal without the disturbance of the displays by each other using a single anode type bar graph device.

An object of the invention is to provide a method and circuit for controlling a band display to present a display of good comparability.

Another object of the invention is to provide a method and circuit for controlling a band display to provide a simultaneous display of three signals.

In accordance with the invention, a three-level light intensity variation on the same scale is produced, on the one hand, by changing the current of the display elements, and, on the other hand, by changing the scanning speed.

The method of the invention utilizes two display intensity changing methods. In addition to changing the current of the display elements, the scanning speed is changed. An especially visual display is produced so that the first light intensity level forms, on the scale, a light spot of a defined length displaying the value of the first analog signal, and the second, middle intensity, level forms an essentially uniform light column displaying the value of the second analog signal, whereas the third intensity level separates the displays of the first and second signals from each other, when necessary. In other words, one of the signals displayed on the same scale takes the form of a uniform light column and the other takes the form of a dotted light spot or broken light column.

The method of the invention is of a special importance, since a gas discharge tube of the aforedescribed type is used as a display unit. This is because neither of the display intensity changing methods is then solely sufficient, since visible light on three different levels is necessary to provide the display. The three levels are the intensity level of a uniform light column, the intensity level of a dotted light spot, where there are three display elements, for example, and the intensity level corresponding to the minimum energy required for a discharge transfer.

Although the current may be electrotechnically separated into several levels with ease, the technical limitations of the discharge tube do not permit the use of sufficiently high dynamics for vision. In this method, the intensity level difference between the uniform light column and the discharge transfer energy is realized by current modulation.

The light intensity of the dotted display is elevated to a brighter level than that of the uniform light column by multiplying the duration of the discharge occurring at the cathode sub-divisions concerned. This single use of the so-called time modulation for the controlling of several intensity levels is, on the one hand, restricted to the maximum speed permitted for the tube, and, on the other hand, restricted to the minimum scanning frequency, at which time the human eye sees a disturbing flicker in the display. The method of the invention produces level differences of the displays which are in a proportion of approximately 1:4:16 to each other.

The method of the invention may be realized by circuit forms of several types, either fixed wiring with analog or digital components, or a programming microprocessor.

In accordance with the invention, a method for a band display of at least two analog signals in a display device having a display scale with a plurality of successive display elements of which a part defined by an analog signal in each scanning cycle is made luminous by a specified scanning frequency to produce an analog display, comprises changing the current supply to the display elements and changing the scanning speed of the display elements to produce a three level variation of light intensity on the same display scale.

A light spot of a specified length displaying the value of a first analog signal is provided on the display scale by a first level of light intensity. A substantially uniform light column displaying the value of a second analog signal is provided on the display scale by a second, middle, level of light intensity. A separation is provided on the display scale between the first analog signal display and the second analog signal display by a third level of light intensity.

The first level of light intensity is produced by decreasing the scanning speed of the display elements with regard to the second level and the third level of light intensity and by decreasing the current supply to the display elements with regard to the second level of light intensity.

The display device comprises a phase-controlled gas discharge tube having cathodes, an anode and a cathode control. The first level of light intensity is produced by extending the phase durations of the cathode control of the gas discharge tube. The third level of light intensity is produced by restricting the anode current of the tube to a level corresponding to the minimum energy required for a discharge transfer.

In accordance with the invention, a control circuit for a band display of at least two analog signals wherein first and second analog signals are displayed, comprises a sawtooth generator having an input and first and second outputs and providing sawtooth and reset signals at the first and second outputs, respectively. A first comparator circuit has an output, a first input to which the first analog signal is supplied and a second input connected to the first output of the sawtooth generator. The first comparator compares the first analog signal with the first sawtooth signal and provides at its output a pulse for forming the display. A display device has display elements. A deceleration duration circuit defines the scanning speed deceleration duration of the display elements. The deceleration duration circuit has an output and an input connected to the output of the first comparator circuit. A phase duration circuit has a first input connected to the output of the deceleration duration circuit, a second input, a first output and a second output coupled to the display device. The phase duration circuit defines the scanning speed of the display elements under the control of the deceleration duration circuit. A sawtooth generator stopping circuit has a first input connected to the output of the deceleration duration circuit, a second input connected to the first output of the phase duration circuit and an output connected to the input of the sawtooth generator. The sawtooth generator stopping circuit decelerates an increase of the sawtooth signal. A second comparator circuit has a output, a first input to which the second analog signal is supplied and a second input connected to the first output of the sawtooth generator. The second comparator circuit compares the second analog signal with the sawtooth signal and provides at its output a pulse for forming the display. A current restricting circuit has an output connected to the display elements of the display device and an input coupled to the output of the second comparator circuit. The current restricting circuit restricts the current of the display elements under the control of the output pulse of the second comparator circuit.

The display device comprises a phase-controlled gas discharge tube having phase cathodes and display elements scanned by cyclical control of the phase cathodes in alternating phases. A cathode control defines the control frequency of the phase cathodes. The cathode control comprises a clock oscillator having an output and an input connected to the second output of the sawtooth generator and the phase duration circuit. The second input of the phase duration circuit is connected to the output of the clock oscillator. The clock oscillator and phase duration circuit provide phase pulses at the second output of the phase duration circuit. A control and phase exchange circuit for the phase cathodes has a first input connected to the second output of the sawtooth generator, a second input connected to the second output of the phase duration circuit and an output connected to the gas discharge tube whereby the phase duration circuit is coupled to the gas discharge tube via the control and phase exchange circuit.

The current restricting circuit includes a switching transistor controlled by the phase pulses.

The display elements of the gas discharge tube comprise two display scales. A scale selector circuit is connected between the second output of the sawtooth generator and the display scales of the gas discharge tube. The scale selector circuit is changed in state by the reset signal at the beginning of the operating cycle of the sawtooth generator.

The reset signal locks the clock oscillator, the phase duration circuit and the cathodes of the gas discharge tube via the control and phase exchange circuit.

The phase duration circuit includes a frequency distributor and the control and phase exchange circuit controls the cathodes of the gas discharge tube via a frequency defined by the clock oscillator and the frequency distributor of the phase duration circuit.

The deceleration duration circuit includes a counter connected to the second output of the phase duration circuit and controlled by the phase pulses. The counter is preset to the number of phases to be decelerated.

BRIEF DESCRIPTION OF THE DRAWINGS

For a fuller understanding of the invention, reference is had to the following description taken in connection with the accompanying drawings, in which.

DESCRIPTION OF PREFERRED EMBODIMENTS

Figure 1:
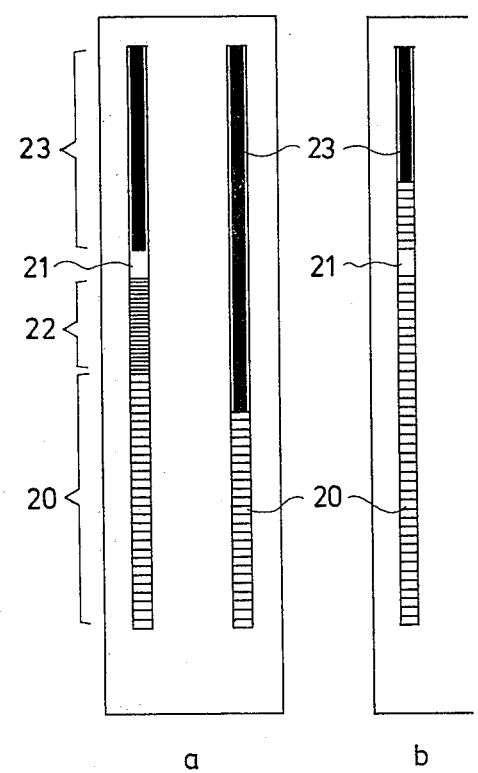
FIGS. 1a and 1b are schematic diagrams of displays provided by the method and circuit of the invention.

FIGS. 1a and 1b are schematic diagrams of a two-scaled band display. The first scale of the band display contains two signals in accordance with the invention. The value of one signal is displayed by a uniform light column 20, and the value of the other signal is displayed by light spot 21, which is a few sub-divisions brighter than the first signal. In FIG. 1a, the light spot signal is higher than the column signal and the signal displays are separated from each other by a discharge transfer part 22. In part 23 of the scale, the anode current of the band display is disconnected. FIG. 1b presents a case in which the light spot signal 21 is smaller than the column signal 20.

Figure 2:
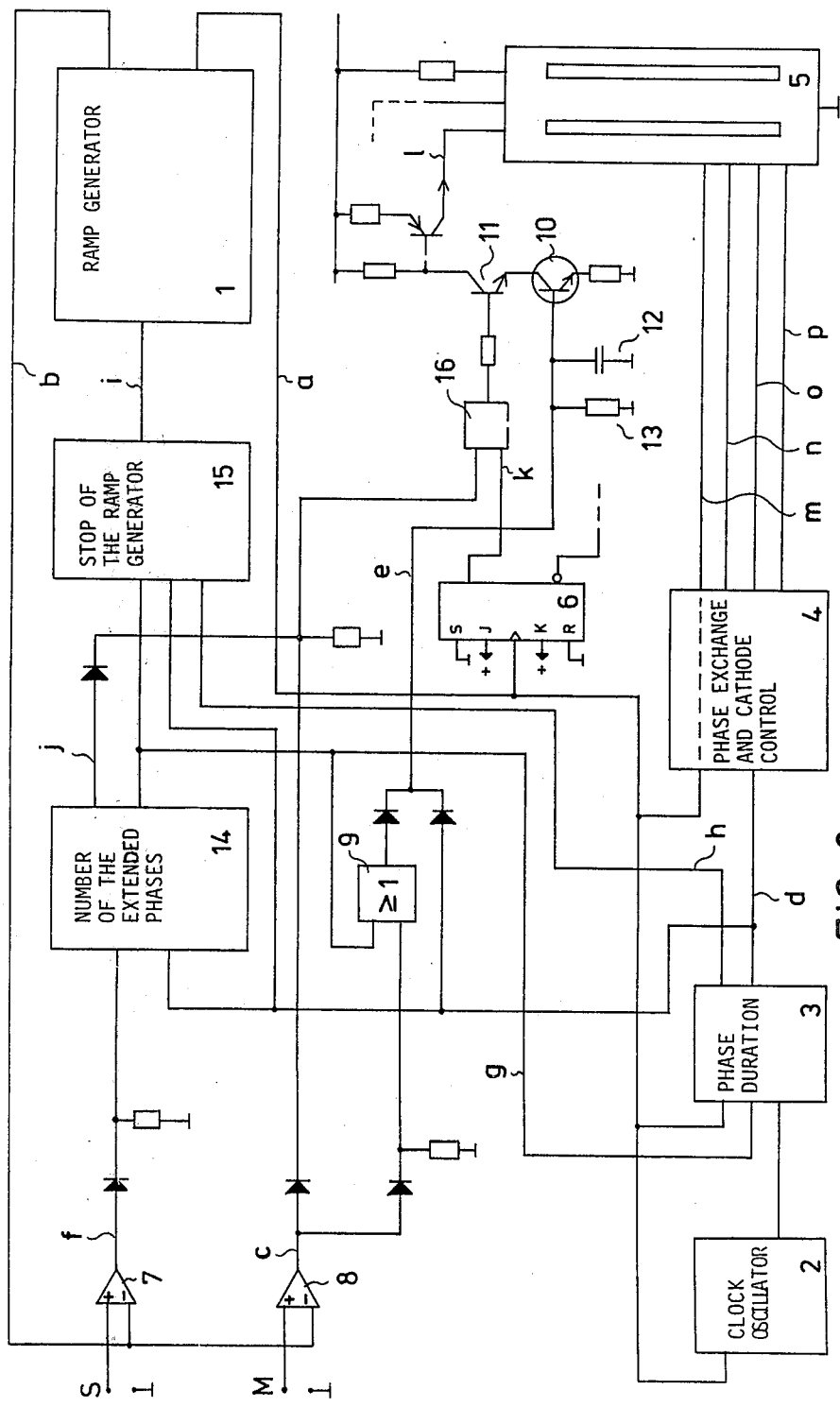
FIG. 2 is a block and circuit diagram of an embodiment of the circuit of the invention.

The control circuit of FIG. 2 includes a ramp or sawtooth generator 1, which at the beginning of an operating cycle delivers a reset pulse a, which locks a clock oscillator 2, a phase duration circuit 3, a control and phase exchange circuit 4 of the cathodes of the discharge tube and through that a discharge tube 5. The reset pulse a of the ramp generator 1 also changes the state of a scale selector circuit or flip flop 6. The ramp generator 1 supplies comparator circuits 7 and 8 with a voltage signal b.

The scale selector circuit 6 controls the changing of displays in turn for each scale and always receives the change pulse from the reset signal a. The anode control circuit of one scale is not shown in the FIGS., since it is non-essential to the invention.

As the output voltage of the ramp generator 1 increases, the phase exchange circuit 4 controls the discharge tube cathodes cyclically via a frequency defined by the clock oscillator 2 and a frequency distributor included in the phase duration circuit 3. The control pulses of the discharge tube 5 are shown in FIG. 3 as signals n, o and p.

Analog signals S and M are applied to inputs of comparator circuits 7 and 8, respectively. As long as the voltage signal M at the comparator circuit 8 is smaller than the ramp signal b, a logical 1 state prevails in the output of an OR gate circuit 9 and a transistor 10 is controlled in voltage. An anode current l also receives a specific value, since a switching transistor 11 is open due to the state of the control signal applied to it. As the ramp voltage exceeds the signal voltage S, the state of a signal c is changed. The OR gate 9 then changes its state to a logical 0, if a cycle of "extended phases" is not in operation simultaneously, at which time a signal g would be in the logical 1 state.

Figure 3:
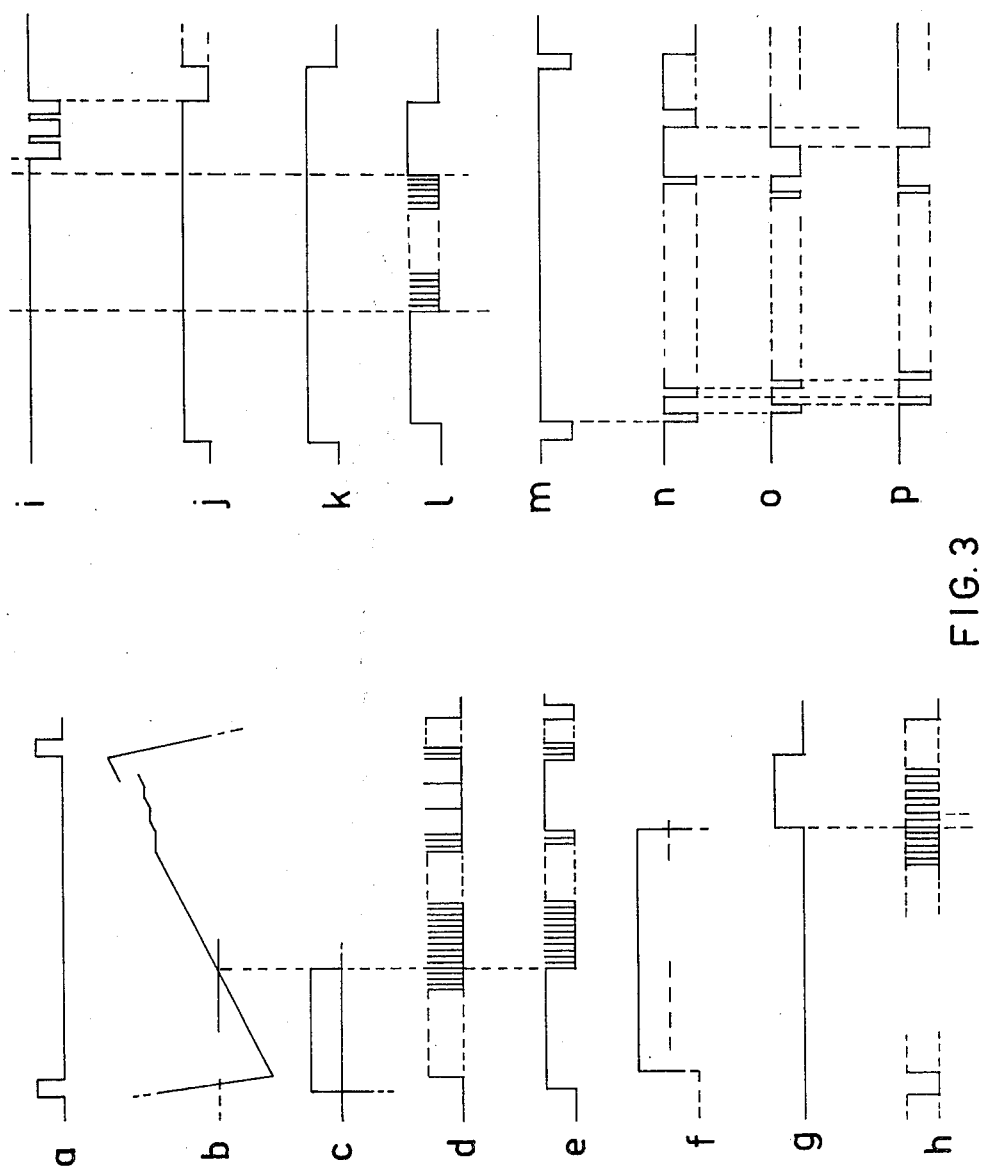
FIGS. 3a and 3p are graphical presentations of voltages and currents at different points of the circuit of FIG. 2.

FIG. 3 shows a so-called phase conveying cycle, during which the transistor 10 receives a pulse-like control signal d from the phase duration circuit 3. A condenser 12 and a resistor 13 are connected to the base electrode of the transistor 10 and define the level of the charge, which is transferred to the anode per each cathode sub-division. The level of the charge guarantees, on the one hand, a sufficient ionization charge in the discharge tube 5, and, on the other hand, as invisible a light as possible. This is achieved by momentarily disconnecting the current.

As the ramp voltage further increases, the level of the signal voltage S is at last reached. The comparator circuit 7 changes its output signal f to a negative value. An extended phase calculator circuit 14 contains a counter preset to the number of the "extended phases". Pulses d from the phase duration circuit 3 are simultaneously applied to the extended phase calculator circuit 14, which then produces a command signal g to said phase duration circuit, extending the duration of the phases. As a result, the durations of the discharge tube control pulses are extended, which produces a brighter display than previously, since the anode current also ascends to the intensity level of the column display via the OR gate 9. A signal h, which is at a delayed stage with regard to the phase extension signal g, the phase exchange pulse d and the pulse g control the ramp generator stop circuit 15. The ramp generator stop circuit 15 then produces a signal i which delays the increase of the ramp signal b. Since the signal i is in the logical 0 state, the increase of the ramp voltage b is stopped.

After the number of the extended phases is completed, a signal j produced by the extended phase calculator circuit 14 changes to a logical 0 state, as does the signal g. The anode current circuit of the discharge tube 5 is switched off via an AND gate 16. The light discharge is also switched off via the AND gate 16. The ramp or sawtooth voltage continues to increase up to its full display value, after which the ramp generator 1 produces a reset pulse. The following display cycle is transferred to the other scale by the scale selector circuit 6. In principle, the series of aforedescribed occurrences may be repeated infinitely.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method for a single anode bar graph band display of at least two analog signals in one scale of a display having a display scale with a plurality of successive display elements of which a part defined by an analog signal in each scanning cycle is made luminous by a specified scanning frequency to produce an analog display, said method comprising changing the current supply to the display elements; and changing the scanning speed of said display elements, whereby a three level variation of light intensity is obtained on the same display scale.

2. A method as claimed in claim 1, wherein a light spot of a specified length displaying the value of a first analog signal is provided on the display scale by a first level of light intensity, a substantially uniform light column displaying the value of a second analog signal is provided on the display scale by a second, middle, level of light intensity, and a separation is provided on the display scale between the first analog signal display and the second analog signal display by a third level of light intensity.

3. A method as claimed in claim 2, wherein the first level of light intensity is produced by decreasing the scanning speed of said display elements with regard to the second level and the third level of light intensity and by decreasing the current supply to said display elements with regard to said second level of light intensity.

4. A method as claimed in claim 3, wherein the display device comprises a phase-controlled gas discharge tube having cathodes, an anode and a cathode control, the first level of light intensity is produced by extending the phase durations of the cathode control of the gas discharge tube and the third level of light intensity is produced by restricting the anode current of the tube to a level corresponding to the minimum energy required for a discharge transfer.

5. A control circuit for a band display of at least two analog signals wherein first and second analog signals are displayed, said control circuit comprising
a sawtooth generator having an input and first and second outputs and providing sawtooth and reset signals at the first and second outputs, respectively;
a first comparator circuit having an output, a first input to which the first analog signal is supplied and a second input connected to the first output of said sawtooth generator, said first comparator comparing said first analog signal with said first sawtooth signal and providing at its output a pulse for forming the display;
display means having display elements;
deceleration duration means for defining the scanning speed deceleration duration of the display elements, said deceleration duration means having an output and an input connected to the output of said first comparator circuit;
a phase duration circuit having a first input connected to the output of said deceleration duration means, a second input, a first output and a second output coupled to the display means, said phase duration circuit defining the scanning speed of the display elements under the control of said deceleration duration means;
sawtooth generator stopping means having a first input connected to the output of said deceleration duration means, a second input connected to the first output of said phase duration circuit and an output connected to the input of said sawtooth generator, said sawtooth generator stopping means decelerating an increase of said sawtooth signal;
a second comparator circuit having an output, a first input to which the second analog signal is supplied and a second input connected to the first output of said sawtooth generator, said second comparator circuit comparing said second analog signal with said sawtooth signal and providing at its output a pulse for forming the display; and
current restricting means having an output connected to the display elements of the display means and an input coupled to the output of said second comparator circuit, said current restricting means restricting the current of said display elements under the control of the output pulse of said second comparator circuit.

6. A control circuit as claimed in claim 5, wherein said display means comprises a phase-controlled gas discharge tube having phase cathodes and display elements scanned by cyclical control of the phase cathodes in alternating phases, and further comprising cathode control means for defining the control frequency of said phase cathodes, said cathode control means comprising a clock oscillator having an output and an input connected to the second output of said sawtooth generator and said phase duration circuit, the second input of said phase duration circuit being connected to the output of said clock oscillator, said clock oscillator and phase duration circuit providing phase pulses at the second output of said phase duration circuit, and a control and phase exchange circuit for said phase cathodes, said control and phase exchange circuit having a first input connected to the second output of said sawtooth generator, a second input connected to the second output of said phase duration circuit and an output connected to said gas discharge tube whereby said phase duration circuit is coupled to said gas discharge tube via said control and phase exchange circuit.

7. A control circuit as claimed in claim 6, wherein said current restricting means includes a switching transistor controlled by said phase pulses.

8. A control circuit as claimed in claim 6, wherein the display elements of said gas discharge tube comprise two display scales, and further comprising a scale selector circuit connected between the second output of said sawtooth generator and the display scales of said gas discharge tube, said scale selector circuit being changed in state by said reset signal at the beginning of the operating cycle of said sawtooth generator.

9. A control circuit as claimed in claim 6, wherein said reset signal locks said clock oscillator, said phase duration circuit and the cathodes of said gas discharge tube via said control and phase exchange circuit.

10. A control circuit as claimed in claim 6, wherein said phase duration circuit includes a frequency distributor and said control and phase exchange circuit controls the cathodes of said gas discharge tube via a frequency defined by said clock oscillator and the frequency distributor of said phase duration circuit.

11. A control circuit as claimed in claim 6, wherein said deceleration duration means includes a counter connected to the second output of said phase duration circuit and controlled by said phase pulses, said counter being preset to the number of phases to be decelerated.

* * * * *